US012684940B2

(12) United States Patent
Wen et al.

(10) Patent No.: US 12,684,940 B2
(45) Date of Patent: Jul. 14, 2026

(54) DISPLAY PANEL

(71) Applicant: BOE TECHNOLOGY GROUP CO., LTD., Beijing (CN)

(72) Inventors: Xiangmin Wen, Beijing (CN); Na Bi, Beijing (CN); Yansong Li, Beijing (CN); Haidong Wu, Beijing (CN); Yan Fan, Beijing (CN); Hao Gao, Beijing (CN); Cheng Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 374 days.

(21) Appl. No.: 18/279,063

(22) PCT Filed: Nov. 29, 2022

(86) PCT No.: PCT/CN2022/134976
§ 371 (c)(1),
(2) Date: Aug. 27, 2023

(87) PCT Pub. No.: WO2024/113154
PCT Pub. Date: Jun. 6, 2024

(65) Prior Publication Data
US 2025/0040342 A1 Jan. 30, 2025

(51) Int. Cl.
*H10K 10/20* (2023.01)
*H10K 50/852* (2023.01)
(Continued)

(52) U.S. Cl.
CPC ..... *H10K 50/852* (2023.02); *H10K 59/80521* (2023.02); *H10K 2102/351* (2023.02)

(58) Field of Classification Search
CPC ........... H10K 50/852; H10K 59/80521; H10K 2102/351; H10K 50/17; H10K 59/35; G02F 1/133; G09F 9/30
See application file for complete search history.

(56) References Cited

U.S. PATENT DOCUMENTS

| | | | |
|---|---|---|---|
| 2011/0084291 A1* | 4/2011 | Jeong | H10K 59/35 257/89 |
| 2014/0191202 A1* | 7/2014 | Shim | H10K 59/876 257/40 |

(Continued)

FOREIGN PATENT DOCUMENTS

| | | |
|---|---|---|
| CN | 103647026 A | 3/2014 |
| CN | 107154415 A | 9/2017 |

(Continued)

*Primary Examiner* — Samuel Park
(74) *Attorney, Agent, or Firm* — HOUTTEMAN LAW LLC

(57) ABSTRACT

The present disclosure provides a display panel, and belongs to the technical field of display. The display panel in the present application includes a base substrate and a plurality of pixel units on the base substrate. Each of the pixel units includes a plurality of light-emitting units emitting light in different colors. Each of the the plurality of light-emitting unit includes a first electrode, an organic functional layer and a second electrode stacked sequentially along a direction away from the base substrate. Among the plurality of light-emitting units emitting light in different colors in each pixel unit, the second electrode of the light-emitting unit emitting light with a shortest wavelength has a smallest thickness along a direction perpendicular to the base substrate.

16 Claims, 9 Drawing Sheets

(51) Int. Cl.
H10K 59/80 (2023.01)
*H10K 102/00* (2023.01)

(56) References Cited

U.S. PATENT DOCUMENTS

| | | | |
|---|---|---|---|
| 2015/0102305 A1* | 4/2015 | Jung ..................... | H10K 50/82 |
| | | | 257/40 |
| 2015/0188087 A1* | 7/2015 | Lee ........................ | H10K 50/19 |
| | | | 257/40 |
| 2015/0364715 A1* | 12/2015 | Yoon ............... | H10K 59/80524 |
| | | | 257/40 |
| 2017/0162631 A1* | 6/2017 | Hamada ................. | H10K 50/11 |
| 2019/0157364 A1* | 5/2019 | Yan ...................... | H10K 59/173 |
| 2020/0006692 A1* | 1/2020 | Seok .................... | H10K 50/852 |
| 2020/0075693 A1* | 3/2020 | Polyakov .............. | H10K 59/38 |
| 2025/0221147 A1* | 7/2025 | Chen ................... | H10K 50/115 |

FOREIGN PATENT DOCUMENTS

| | | | |
|---|---|---|---|
| CN | 108511628 A | 9/2018 |
| CN | 110301053 A | 10/2019 |
| CN | 110867523 A | 3/2020 |
| CN | 111146363 A | 5/2020 |
| CN | 111224007 A | 6/2020 |
| CN | 112054048 A | 12/2020 |
| CN | 112889162 A | 6/2021 |
| JP | 2009266459 A | 11/2009 |

* cited by examiner

Colour cast

B
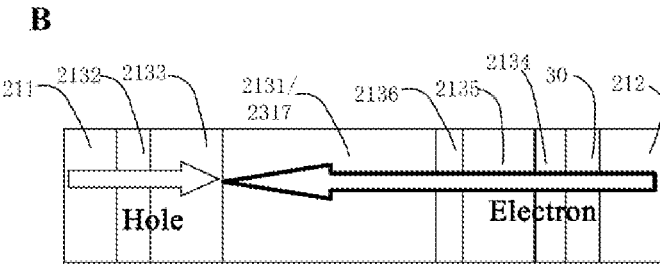
FIG.6
R/G
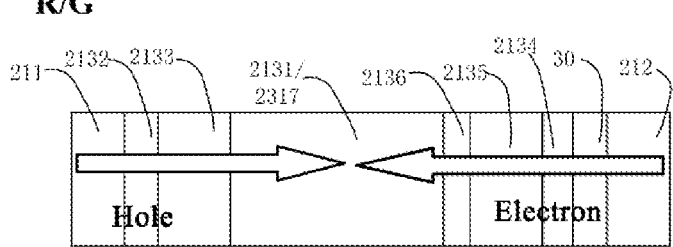
FIG.7
| R Cathode | | |
|---|---|---|
| CPM1:CPM2 | G Cathode | |
| | CPM1:CPM2 | B Cathode |
| EIL | | CPM1:CPM2 |
| ETL | | |
| | HBL | |
| R EML | G EML | |
| | | B EML |
| R prime | G prime | B prime |
| HTL | | |
| HIL | | |
| R Anode | G Anode | B Anode |
| 10 | | |
FIG.8a

DISPLAY PANEL

FIELD OF THE PRESENT DISCLOSURE

The present disclosure belongs to the technical field of display, and particularly relates to a display panel.

BACKGROUND OF THE PRESENT DISCLOSURE

Organic Light-emitting Diodes (OLEDs) have attracted considerable attention for the advantages such as wide viewing angles, excellent contrast, fast response, high brightness, low driving voltage, flexibility, and the like. At present, the OLED display device has been widely applied to the fields of display panels such as mobile phones, flat panels, televisions, vehicles, and the like. In order to make OLED displays suitable for various applications, OLED displays are made flexible and applied to products having folding screens or curved screens, but since white light in OLED displays is formed by mixing red, green and blue lights, the resultant white light is subject to colour cast when the luminance and hue of the three colors are inconsistent with the change of viewing angle.

The main reasons for the yellowing of the current OLED display products when being viewed at a large-viewing-angle and the yellowing in the bent display areas of the displays having a folded screen, a curved screen or the like are that the wavelength of blue light is shortest, the L-Decay rate of the luminance of a blue light-emitting unit along with the angle is too high, the wavelength of red light is longest, and the L-Decay rate of the luminance of a red light-emitting unit along with the angle is slower, as shown in FIG. 1. Therefore, how to solve the colour cast of the display product at different angles is a technical problem which needs to be solved urgently.

SUMMARY OF THE PRESENT DISCLOSURE

The present disclosure provides a display panel in order to solve at least one of the technical problems existing in the prior art.

As a first aspect, an embodiment of the present disclosure provides a display panel, including a base substrate, a plurality of pixel units on the base substrate, wherein each of the plurality of the pixel units comprises a plurality of light-emitting units emitting light in different colors; each of the the plurality of light-emitting unit includes a first electrode, an organic functional layer and a second electrode stacked sequentially along a direction away from the base substrate. Among the plurality of light-emitting units emitting light in different colors in each pixel unit, the second electrode of the light-emitting unit emitting light with a shortest wavelength has a smallest thickness along a direction perpendicular to the base substrate.

The second electrodes of the plurality of light-emitting units in each pixel unit are formed as a one-piece structure as a second electrode layer.

Each of the plurality of light-emitting units includes a first auxiliary structure on a side of the organic functional layer proximal to the second electrode layer; and an adsorption force of the first auxiliary structure of the light-emitting unit emitting light with the shortest wavelength on a material of the second electrode layer is the smallest.

The first auxiliary structure includes a first material and/or a second material; the first material is a nucleation inhibition material for the material of the second electrode layer; the second material is a nucleation promoting material for the material of the second electrode layer.

Thicknesses of the first auxiliary structures are the same as each other; the first auxiliary structure includes the first material and the second material, proportions of the first materials in the first auxiliary structures of the plurality of light-emitting units emitting different colors are different from each other, and the shorter a wavelength of light emitted from the light-emitting device is, the greater the proportion of the first material in the first auxiliary structure of the light-emitting device is.

Thicknesses of the first auxiliary structures are the same as each other, and the first auxiliary structure includes the first material and the second material, the first auxiliary structure of the light-emitting unit emitting light with the shortest wavelength among the plurality of light-emitting units includes the first material with a largest proportion, the first auxiliary structures of the other light-emitting units include the first material with a same proportion.

Each of the first auxiliary structures is made of the first material; the shorter the wavelength of light emitted from the light-emitting unit is, the thicker the first auxiliary structure of the light-emitting unit is.

Each of the first auxiliary structures is made of the first material; the first auxiliary structure of the light-emitting unit emitting light with the shortest wavelength among the plurality of light-emitting units has a largest thickness, the first auxiliary structures of the other light-emitting units have a same thickness.

Each of the first auxiliary structures is made of the second material; the shorter the wavelength of light emitted from the light-emitting unit is, the thinner the first auxiliary structure of the light-emitting unit is.

Each of the first auxiliary structures is made of the second material; the first auxiliary structure of the light-emitting unit emitting light with the shortest wavelength among the plurality of light-emitting units has a smallest thickness, the first auxiliary structures of the other light-emitting units have a same thickness.

The first auxiliary structure includes the first material, the first material is selected from one or more of polytetrafluoroethylene (PTFE), silicon or silicone-based polymer, 3-(4-biphenyl)-4-phenyl-5-tert-butylphenyl-1,2,4-Triazole (TAZ), aluminum (III) bis(2-methyl-8-quninolinato)-4-phenylphenolate (BAlq), 2-(4-(9,10-di(naphthalen-2-yl)anthracen-2-yl)phenyl)-1-phenyl-1H-benzo-[D]imidazole (LG201), 8-hydroxyquinoline lithium (Liq), N(biphenyl-4-yl)9,9-dimethyl-N-(4(9-phenyl-9H-carbazole-3-yl)phenyl)-9H-fluorene-2-amine (HT211), and the like.

The first auxiliary structure includes the second material, the second material is selected from one or more of the fullerene including C60, C70, C76, or C84, single-walled carbon nanotubes, multi-walled carbon nanotubes, and the like.

The organic functional layer includes a hole injection layer, a hole transport layer, a light-emitting layer, a hole blocking layer, an electron transport layer, and an electron injection layer stacked in sequence along in a direction away from the first electrode.

The hole injection layers of the light-emitting units in each pixel unit are formed as a one-piece structure, the hole transport layers of the light-emitting units in each pixel unit are formed as a one-piece structure, the hole blocking layers of the light-emitting units in each pixel unit are formed as a one-piece structure, the electron injection layers of the light-emitting units in each pixel unit are formed as a one-piece structure, and the electron transport layers of the light-emitting units in each pixel unit are formed as a one-piece structure.

The light-emitting unit further includes a second auxiliary structure between the hole transport layer and the light-emitting layer, the second auxiliary structure is configured to adjust a length of a resonant cavity formed between the first electrode and the second electrode of the light-emitting unit.

A wavelength of light emitted from the light-emitting unit is positively correlated with a thickness of the second auxiliary structure in the direction perpendicular to the base substrate.

A thickness of the cathode of the light-emitting unit in the direction perpendicular to the base substrate is positively correlated with a thickness of the second auxiliary structure in the direction perpendicular to the base substrate.

The light-emitting units emitting light in different colors in each pixel unit include a red light-emitting unit, a green light-emitting unit, and a blue light-emitting unit.

BRIEF DESCRIPTION OF THE DRAWINGS

FIG. 6 is a schematic view showing a position of excitons formed by electrons and holes of a blue light-emitting unit according to an embodiment of the present disclosure.

FIG. 7 is a schematic diagram showing a position of excitons formed by electrons and holes of a red light-emitting unit and a green light-emitting unit according to an embodiment of the present disclosure.

FIG. 8*a* is a cross-sectional view of a pixel unit according to a second example of a display panel in an embodiment of the present disclosure.

DETAILED DESCRIPTION OF THE EXEMPLARY EMBODIMENTS

In order to make the technical solutions of the present invention better understood, the present invention is further described in detail with reference to the accompanying drawings and the detailed description below.

Unless defined otherwise, technical or scientific terms used herein shall have the ordinary meaning as understood by one of ordinary skill in the art to which this present disclosure belongs. The use of "first," "second," and the like in this present disclosure is not intended to indicate any order, quantity, or importance, but rather is used to distinguish one element from another. Also, the use of the terms "a," "an," or "the" and similar referents do not denote a limitation of quantity, but rather denote the presence of at least one. The word "comprising" or "comprises", and the like, means that the element or item preceding the word comprises the element or item listed after the word and its equivalent, but does not exclude other elements or items. The terms "connected" or "coupled" and the like are not restricted to physical or mechanical connections, but may include electrical connections, whether direct or indirect. "upper", "lower", "left", "right", and the like are used only to indicate relative positional relationships, and when the absolute position of the object being described is changed, the relative positional relationships may also be changed accordingly.

Figure 1:
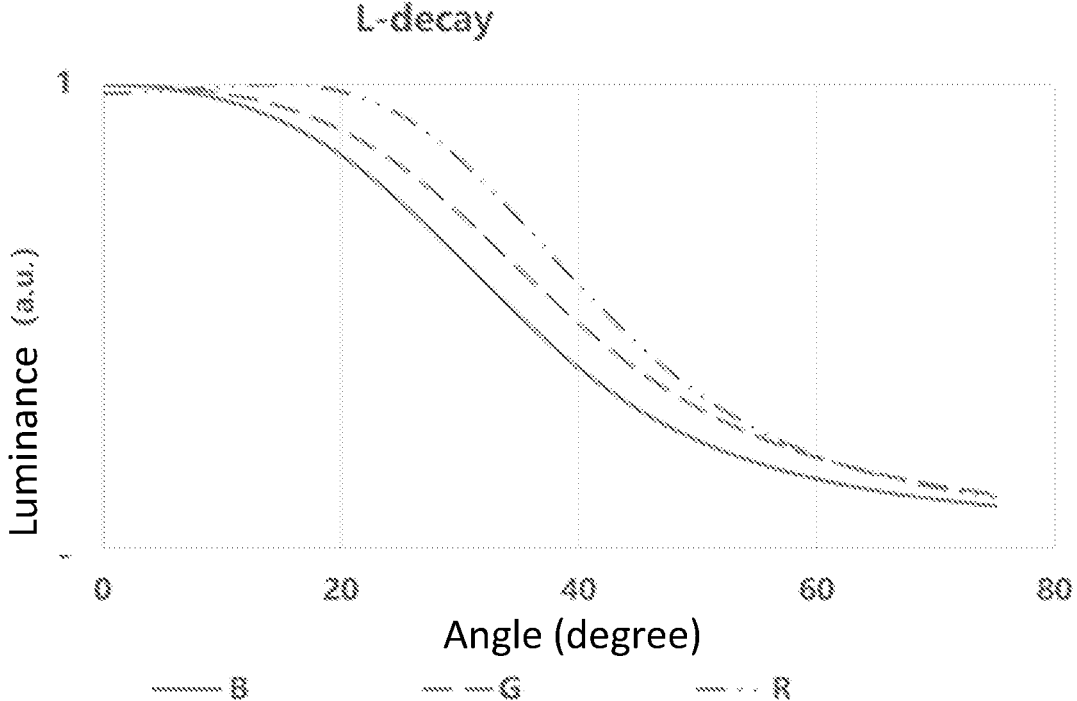
FIG. 1 shows L-Decay curves of a red light-emitting unit, a green light-emitting unit, and a blue light-emitting unit in the related art.
Figure 2:
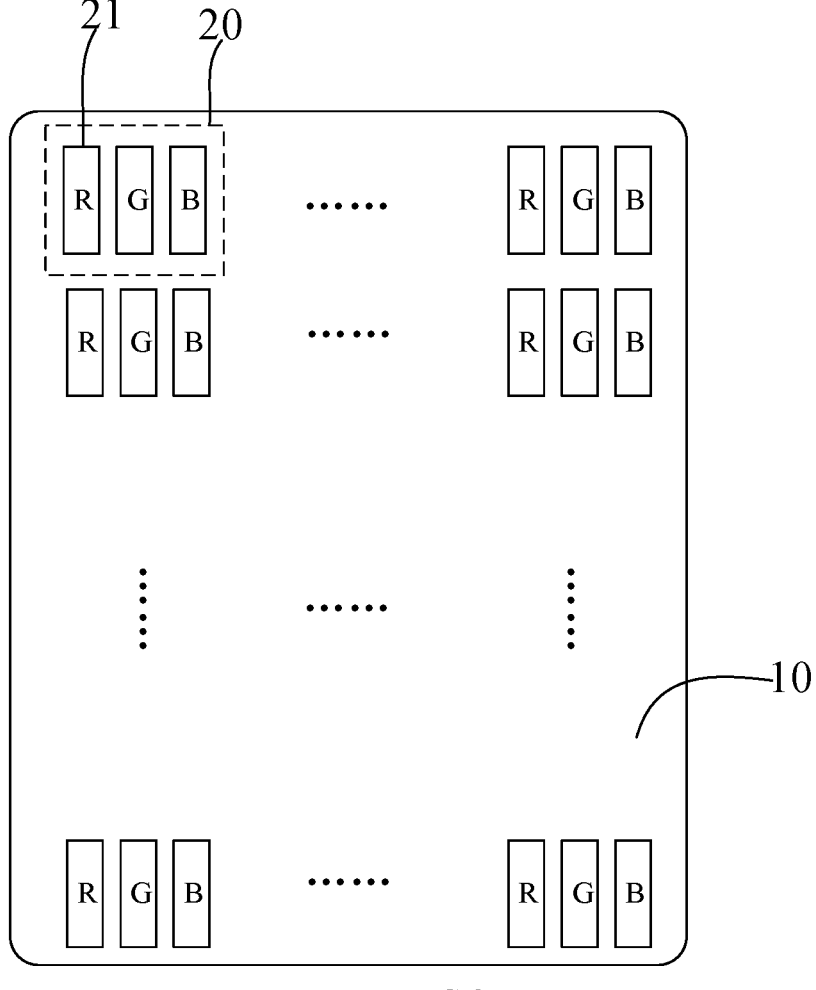
FIG. 2 is a schematic diagram showing a display panel according to an embodiment of the present disclosure.

In a first aspect, FIG. 2 is a schematic diagram showing a display panel according to an embodiment of the present disclosure. As shown in FIG. 2, an embodiment of the present disclosure provides a display panel including a base substrate 10 and a plurality of pixel units 20 on the base substrate 10. Each of the pixel units 20 may include a plurality of sub-pixels 21 emitting various colors, and each of the sub-pixels 21 includes a pixel driving circuit and a light-emitting unit connected to the pixel driving circuit. The colour of light emitted by the light-emitting unit determines the colour of the sub-pixel 21. In the embodiment of the present disclosure, each pixel unit 20 includes three sub-pixels 21 of red, green and blue, that is, the three sub-pixels in each pixel unit 20 are a red light-emitting unit R, a green light-emitting unit G and a blue light-emitting unit B, respectively. Of course, it should be understood that the colours of the sub-pixels 21 in each pixel unit 20 is not limited thereto, and other embodiments in which each pixel unit 20 includes two or more sub-pixels 21 in different colours is within the scope of the embodiments of the present disclosure.

In the embodiment of the present disclosure, each light-emitting unit includes a first electrode (i.e., an anode), an organic functional layer, and a second electrode (i.e., a cathode) sequentially arranged in a direction away from the base substrate 10. For each pixel unit 20, a thickness, in the direction perpendicular to the base substrate 10, of the cathode of the light-emitting unit with the shortest wavelength is set to be the smallest. In the embodiment of the present disclosure, each pixel unit 20 includes light-emitting units of three colours, namely, a red light-emitting unit R, a green light-emitting unit G, and a blue light-emitting unit B, and the wavelength of the blue light-emitting unit B is the shortest, that is, the cathode of the blue light-emitting unit B is set to be the thinnest. Since the cathode is generally made of metal materials, the transmittance of blue light in the blue light-emitting unit B can be effectively improved due to the thinnest cathode of the blue light-emitting unit B, thereby alleviating the colour deviation problem caused by the rapid attenuation of L-Decay in blue light-emitting unit B.

In some examples, the cathode of the light-emitting unit is generally formed through an evaporation process, and the cathodes of the light-emitting units in at least the same pixel unit 20 are formed as a one-piece structure as a second electrode layer.

In some examples, since the cathodes of the light-emitting units in the same pixel unit 20 are formed as a one-piece structure, in order to ensure that the cathodes of the blue light-emitting unit B, the red light-emitting unit R, and the green light-emitting unit G have different thicknesses, a first auxiliary structure may be formed on a side of the organic functional layer of each light-emitting unit away from the anode. An adsorption force of the first auxiliary structure in the blue light-emitting unit B on the material of the second conductive layer is minimized, so that the thickness of the second conductive layer at the position corresponding to the blue light-emitting unit B (i.e., the cathode of the blue light-emitting unit B) is minimized.

The structure of the display panel will be described below with reference to the materials selected for the first auxiliary structure. Since the structures of the pixel units 20 in the display panel are the same, an embodiment in which each pixel unit 20 includes red, green, and blue light-emitting units R, G, and B will be described as an example.

Figure 3A:
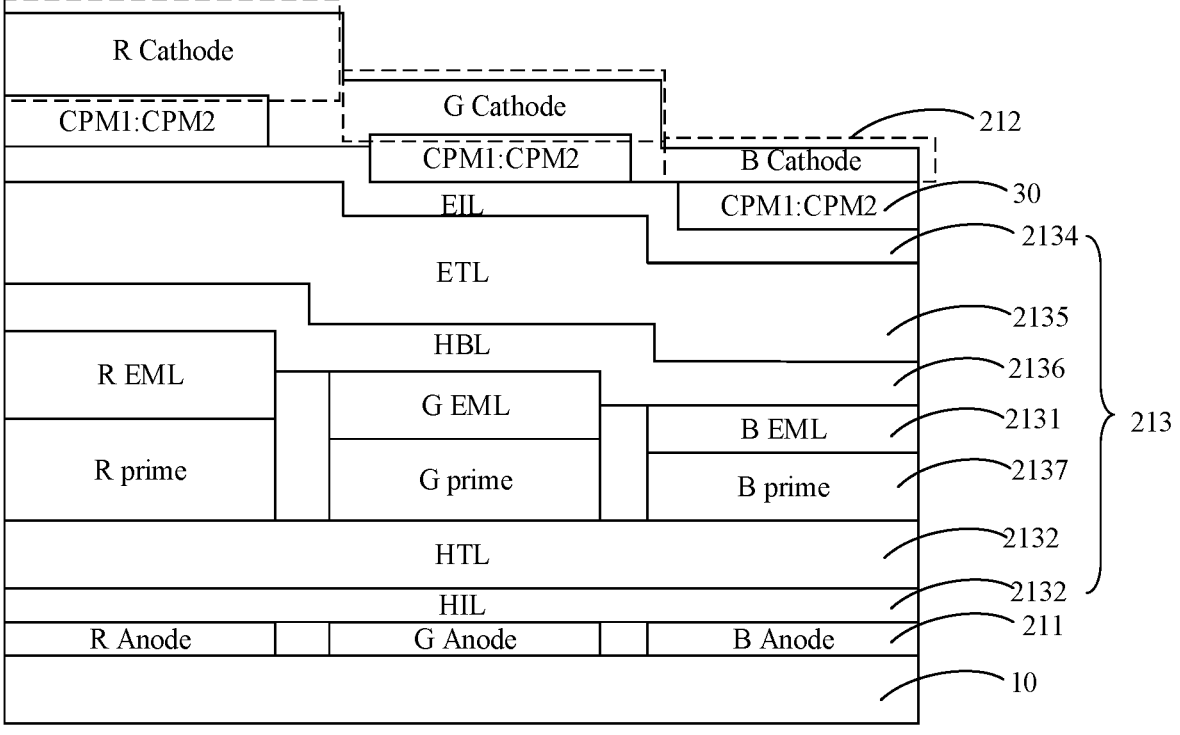
FIG. 3*a* is a cross-sectional view of a pixel unit according to a first example of a display panel in an embodiment of the present disclosure.
Figure 3B:
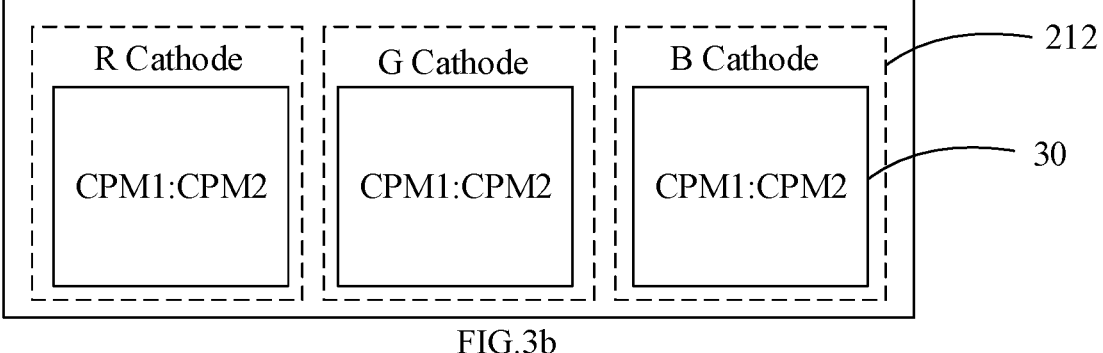
FIG. 3*b* is a top view showing a relationship between first auxiliary structures and cathodes of a pixel unit according to a first example of the display panel in an embodiment of the present disclosure.

The first example is as follows. FIG. 3a is a cross-sectional view of a pixel unit according to a first example of a display panel in an embodiment of the present disclosure; FIG. 3b is a top view showing a relationship between a first auxiliary structure and a cathode of a pixel unit according to a first example of the display panel in an embodiment of the present disclosure. As shown in FIGS. 3a and 3B, each of the red, green and blue light-emitting units R, G and B in the pixel unit includes an anode 211, a cathode 212, an organic functional layer 213 between the cathode and the anode, and the first auxiliary structure 30 between the cathode 212 and the organic functional layer 213. The organic functional layer 213 includes a hole injection layer 2132 (HIL), a hole transport layer 2133 (HTL), an light-emitting layer 2131 (EML), a hole blocking layer 2136 (HBL), an electron transport layer 2135 (ETL), and an electron injection layer 2134 (EIL) sequentially arranged in a direction away from the first electrode. The hole injection layers 2132 of the light-emitting units are formed as a one-piece structure, the hole transport layers 2133 of the light-emitting units are formed as a one-piece structure, the hole blocking layers 2136 of the light-emitting units are formed as a one-piece structure, the electron injection layers 2134 of the light-emitting units are formed as a one-piece structure, and the electron transport layers 2135 of the light-emitting units are formed as a one-piece structure. Thus, the preparation of the pixel unit is convenient, and the cost can be saved.

In the first example, the thicknesses of the first auxiliary structures 30 of the red light-emitting unit R, the green light-emitting unit G, and the blue light-emitting unit B in the pixel unit are the same, and the thicknesses of the cathodes 212 of the red light-emitting unit R, the green light-emitting unit G, and the blue light-emitting unit B are different, wherein the thickness of the cathode 212 of the red light-emitting unit R is greater than that of the cathode 212 of the green light-emitting unit G, and the thickness of the cathode 212 of the green light-emitting unit G is greater than that of the cathode 212 of the blue light-emitting unit B. Each of the first auxiliary structures 30 of the red light-emitting unit R, the green light-emitting unit G, and the blue light-emitting unit B includes a first material and a second material, and only the proportions of the first materials of the first auxiliary structures 30 are different from each other.

Specifically, the first material is a nucleation inhibition material (CPM1) for the material of the second electrode layer, for example, one or more of Polytetrafluoroethylene (PTFE), silicon or silicone-based polymer, 3-(4-biphenyl)-4-phenyl-5-tert-butylphenyl-1,2,4-Triazole (TAZ), aluminum (III) bis(2-methyl-8-quninolinato)-4-phenylphenolate (BAlq), 2-(4-(9,10-di(naphthalen-2-yl)anthracen-2-yl)phenyl)-1-phenyl-1H-benzo-[D]imidazole (LG201), 8-hydroxyquinoline lithium (Liq), N(biphenyl-4-yl)9,9-dim-ethyl-N-(4(9-phenyl-9H-carbazol-3-yl)phenyl)-9H-fluoren-2-amine (HT211) and the like are selected. The second material is a nucleation promoting material (CPM2) for the material of the second electrode layer, for example, one or more of the fullerene including C60, C70, C76, or C84, single-walled carbon nanotubes, multi-walled carbon nanotubes, and the like.

Figure 4:
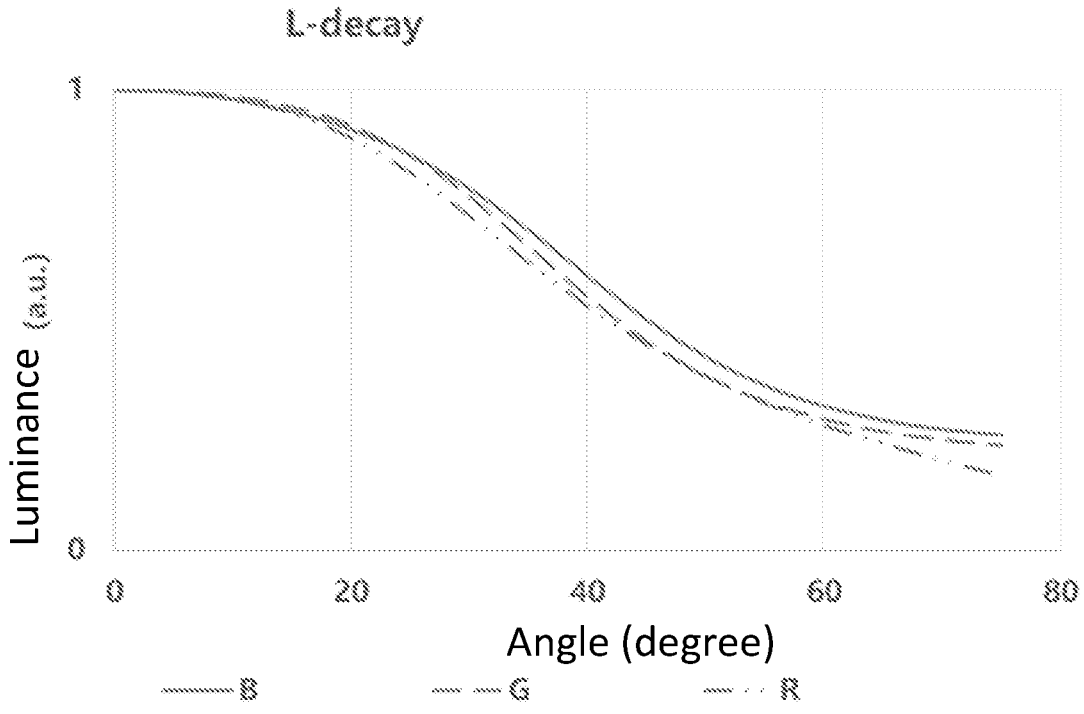
FIG. 4 shows L-Decay curves of a red light-emitting unit, a green light-emitting unit, and a blue light-emitting unit according to a first example.
Figure 5:
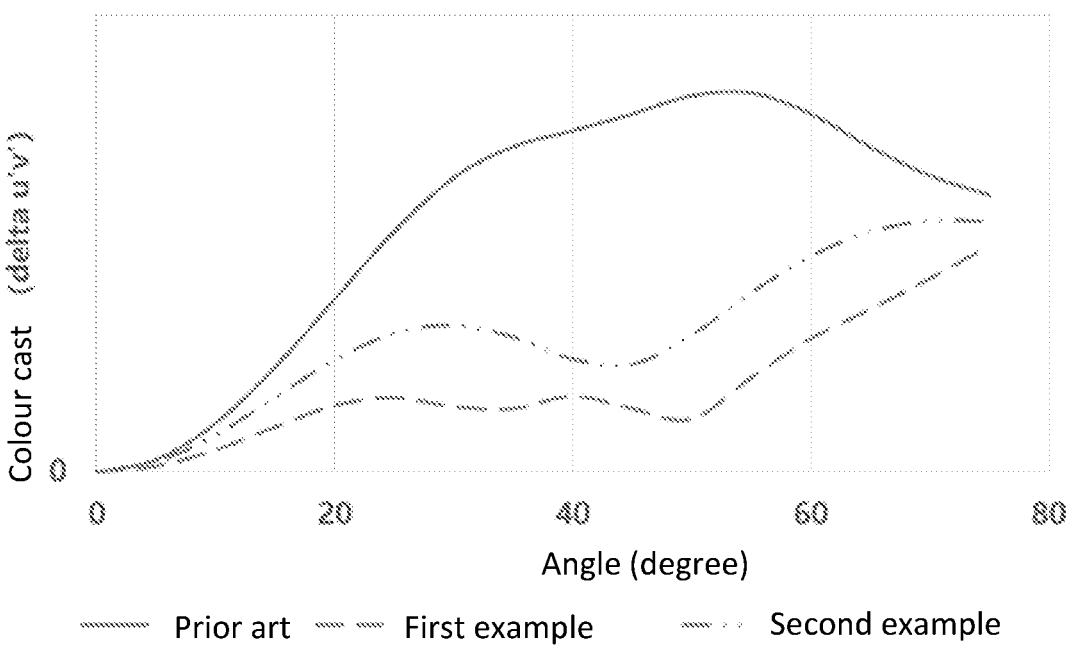
FIG. 5 is a simulation diagram showing improvement in colour casts of the display panels according to the first example and the second example compared to the related display panel.

Further, the thickness of the first auxiliary structure 30 in each of the red light-emitting unit R, the green light-emitting unit G and the blue light-emitting unit B ranges from 1 nm to 15 nm. A mixing proportion of the CPM1 in the first auxiliary structure 30 of the red light-emitting unit R ranges from 0.5% to 30%, a mixing proportion of the CPM1 in the first auxiliary structure 30 of the green light-emitting unit G ranges from 10% to 90%, and a mixing proportion of the CPM1 in the first auxiliary structure 30 of the blue light-emitting unit B ranges from 70% to 99.5%. Since the mixing proportions of the CPM1 in the red light-emitting unit R, the green light-emitting unit G and the blue light-emitting unit B are sequentially increased, the thicknesses of the cathodes 212 of the red light-emitting unit R, the green light-emitting unit G and the blue light-emitting unit B are sequentially thinned, so that the attenuation trends of the L-decay curves for the red light-emitting unit R, the green light-emitting unit G and the blue light-emitting unit B are controlled to be consistent, as shown in FIG. 4, the display colour cast can be further improved, and the simulation results are shown in FIG. 5. Meanwhile, FIG. 6 is a schematic view showing a position of excitons formed by electrons and holes of a blue light-emitting unit according to an embodiment of the present disclosure. FIG. 7 is a schematic diagram showing a position of excitons formed by electrons and holes of a red light-emitting unit and a green light-emitting unit according to an embodiment of the present disclosure. As shown in FIGS. 6 and 7, since CPM1 generally has a better electron injection property, the mixing ratios of CPM1 in the red light-emitting unit R, the green light-emitting unit G, and the blue light-emitting unit B are sequentially increased, as a result, the electron injection of the red light-emitting unit R, the green light-emitting unit G, and the blue light-emitting unit B is also gradually increased, which means that the distribution of the excitons of the red light-emitting unit R, the green light-emitting unit G, and the blue light-emitting unit B gradually approaches an interface between the Prime and the EML, and the distribution of the excitons of the red light-emitting unit R, the green light-emitting unit G, and the blue light-emitting unit B is adjusted, the excitons of the red light-emitting unit R, the green light-emitting unit G and the blue light-emitting unit B can be respectively distributed at the positions where the gains of the optical micro-cavities thereof are maximum, thereby improving the white light efficiency.

Further, the light-emitting unit further includes a second auxiliary structure 2137 (i.e., prime) located between the hole transport layer 2133 and the light-emitting layer 2131, where the second auxiliary structure 2137 is configured to adjust a length of a resonant cavity formed between a first electrode and a second electrode of the light-emitting unit. The wavelength of the light-emitting unit is positively correlated with the thickness of the second auxiliary structure 2137 in the direction perpendicular to the base substrate 10. A thickness of the cathode 212 of the light-emitting unit in a direction perpendicular to the base substrate is positively correlated with a thickness of the second auxiliary structure 2137 in the direction perpendicular to the base substrate. Since the wavelengths of the red light-emitting unit R, the green light-emitting unit G, and the blue light-emitting unit B are sequentially decreased, the thicknesses of the second auxiliary structures 2137 of the red light-emitting unit R, the green light-emitting unit G, and the blue light-emitting unit B in the direction perpendicular to the base substrate 10 are sequentially decreased.

In some examples, the material of the anode 211 includes, but is not limited to, inorganic metal oxides (e.g., Indium Tin Oxide (ITO), zinc oxide (ZnO), or the like), organic conductive polymers (e.g., Poly(3,4-ethylenedioxythiophene)/poly(styrenesulfonate) PEDOT:PSS, polyaniline PANI, or the like), or the like.

The material of the hole injection layer 2132 includes, but is not limited to, any one of 2,3,6,7,10,11-hexacyano-1,4,5,8,9,12-hexaazatriphenylene (HAT-CN), 2,3,5,6-tetrafluoro-7,7',8,8'-tetracyanodimethyl p-benzene (F4-TCNQ), tri (4-bromophenyl) ammonium hexachloroantimonate (TBAHA).

The material of the hole transport layer 2133 includes, but is not limited to, aromatic diamine compounds, triphenylamine compounds, aromatic triamine compounds, biphenyldiamine derivatives, triarylamine polymers, metal complexes, or carbazole polymers, and preferably: any one of N,N'-bis(1-naphthyl)-N,N'-diphenyl-1,1'-biphenyl-4-4'-diamine (NPB), triphenyldiamine derivatives (TPD), TPTE, and 1,3,5-tris(N-3-methylphenyl-N-phenylamino)benzene (TDAB).

The material of the light-emitting layer 2131 includes, but is not limited to, an organic material containing undoped fluorescence material, an organic material including a doped fluorescent material containing a fluorescent dopant and a host material, or an organic material including a doped phosphorescent material containing a phosphorescent dopant and a host material.

The material of the electron transport layer 2135 includes, but is not limited to, any one of 2-(4-biphenyl)-5-phenyl oxadiazole (PBD), 2,5-bis(1-naphthyl)-1,3,5-oxadiazole (BND), and 2,4,6-triphenoxy-1, 3, 5-Triazine (TRZ).

The material of the electron injection layer 2134 includes, but is not limited to, any one of lithium fluoride, sodium fluoride, potassium fluoride, rubidium fluoride, cesium fluoride, lithium oxide, and lithium metaborate.

The material of the cathode 212 includes, but is not limited to, lithium, magnesium, calcium, strontium, aluminum, indium, or the like, or alloys of the above metals with copper, gold, silver, or the like.

It should be noted that the display panel in an embodiment of the present disclosure includes not only the above structure, but also a pixel defining layer on a side of the anode 211 of the light-emitting unit away from the base substrate 10. The pixel defining layer includes accommodating portions which are in one-to-one correspondence with the anodes 211. The hole injection layer 2132, the hole transport layer 2133, the second auxiliary structure 2137, the light-emitting layer 2131, the hole blocking layer 2136, the electron transport layer 2135, and the electron injection layer 2134 are sequentially formed on the pixel defining layer and stacked in the accommodating portion, and the hole injection layer 2132 is in contact with the anode 211. An encapsulation layer may also be formed on a side of the cathode 212 away from the base substrate 10 to prevent water and oxygen from corroding the light-emitting unit, which affects the service life of the light-emitting unit.

Figure 8B:
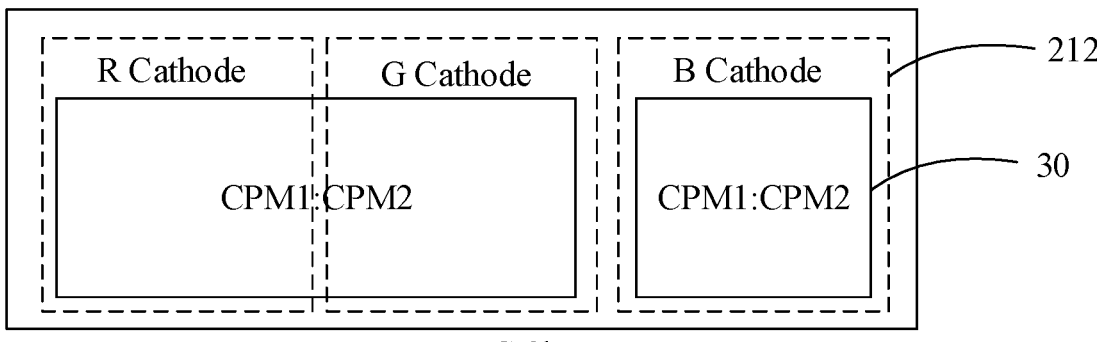
FIG. 8*b* showing a relationship between first auxiliary structures and cathodes of a pixel unit according to a second example of the display panel in an embodiment of the present disclosure.

A second example is as follows. FIG. 8a is a cross-sectional view of a pixel unit according to the second example of a display panel in an embodiment of the present disclosure; FIG. 8b is a top view of a relationship between a first auxiliary structure and a cathode of a pixel unit according to the second example of the display panel in an embodiment of the present disclosure. As shown in FIGS. 8a and 8b, the structure of the pixel unit in the second example is substantially the same as that in the first example except that the first auxiliary structures 30 of the red and green light-emitting units R and G have the same thickness and are formed as a one-piece structure. The cathodes 212 of the red and green light-emitting units R and G have the same thickness.

Specifically, the thicknesses of the red light-emitting unit R, the green light-emitting unit G and the blue light-emitting unit B range from 1 nm to 15 nm, the mixing proportions of CPM1 in the first auxiliary structures 30 of the red light-emitting unit R and the green light-emitting unit G range from 0.5% to 70%, and the mixing proportion of CPM1 in the first auxiliary structure 30 of the blue light-emitting unit B ranges from 70% to 99.5%. Since the blue light-emitting unit B has a higher mixing ratio of CPM1 than those in the red light-emitting unit R and green light-emitting unit G, the thickness of the cathode 212 of the blue light-emitting unit B is thinner than the thickness of the cathode 212 of each of the red light-emitting unit R and green light-emitting unit G, thereby improving the display colour cast due to too fast attenuation of the L-decay curves of blue light, and the simulation results are shown in FIG. 5. Meanwhile, as shown in FIGS. 6 and 7, since CPM1 generally has better electron injection property, and since the blue light-emitting unit B has a higher mixing ratio of CPM1 than those in the red light-emitting unit R and green light-emitting unit G, as a result, the electron injection capability of the blue light-emitting unit B is stronger than those of the red light-emitting unit R and the green light-emitting unit G, therefore the excitons of the blue light-emitting unit B are distributed closer to the interface between the second auxiliary structure 2137 and the light-emitting layer 2131 than the red light-emitting unit R and the green light-emitting unit G. By adjusting the distribution of the excitons in the red light-emitting unit R, the green light-emitting unit G and the blue light-emitting unit B, the excitons of the red light-emitting unit R, the green light-emitting unit G and the blue light-emitting unit B can be respectively distributed at the positions where the gains of the optical micro-cavities thereof are maximum, thereby improving the white light efficiency.

Other structures in the second example are the same as those in the first example, and thus, the description thereof is not repeated.

Figure 9A:
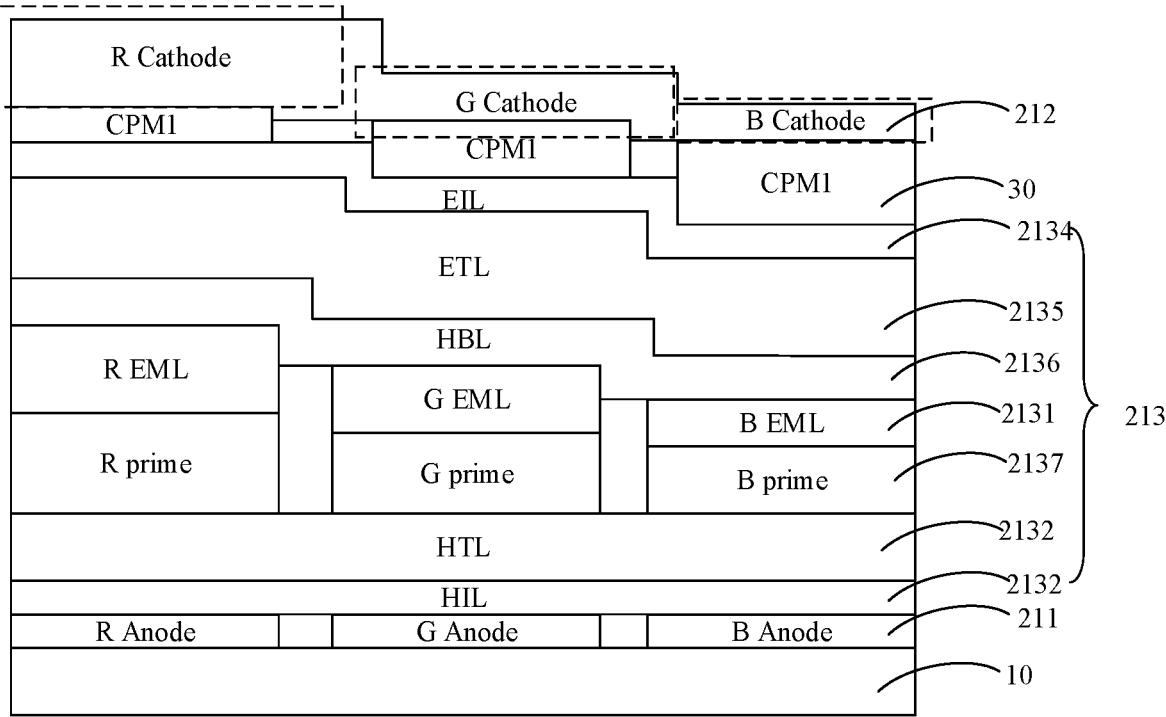
FIG. 9*a* is a cross-sectional view of a pixel unit according to a third example of a display panel in an embodiment of the present disclosure.
Figure 9B:
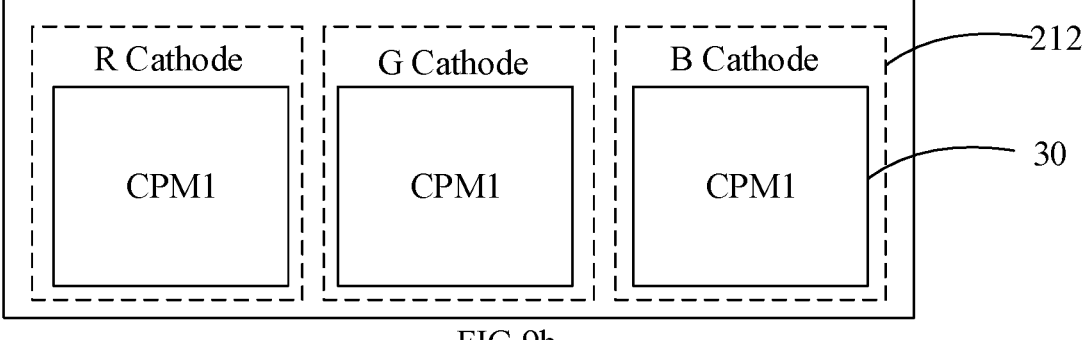
FIG. 9*b* is a top view showing a relationship between first auxiliary structures and cathodes of a pixel unit according to a third example of the display panel in an embodiment of the present disclosure.

A third example is as follows. FIG. 9a is a cross-sectional view of a pixel unit according to the third example of a display panel in an embodiment of the present disclosure; FIG. 9b is a top view of a relationship between a first auxiliary structure and a cathode of a pixel unit according to the third example of the display panel in an embodiment of the present disclosure. As shown in FIGS. 9a and 9B, the structure of the pixel unit in the third example is substantially the same as that in the first example except that the first auxiliary structures 30 of the red, green and blue light-emitting units R, G and B each employ the first material CPM1, and the thicknesses of the first auxiliary structures 30 of the red, green and blue light-emitting units R, G and B are sequentially increased.

The first material is a nucleation inhibition material (CPM1) for the material of the second electrode layer, for example, one or more of Polytetrafluoroethylene (PTFE), silicon or silicone-based polymer, 3-(4-biphenyl)-4-phenyl-5-tert-butylphenyl-1,2,4-Triazole (TAZ),aluminum (III) bis (2-methyl-8-quninolinato)-4-phenylphenolate (BAlq), 2-(4-(9,10-di(naphthalen-2-yl)anthracen-2-yl)phenyl)-1-phenyl-1H-benzo-[D]imidazole (LG201), 8-hydroxyquinoline lithium (Liq), N(biphenyl-4-yl)9,9-dimethyl-N-(4(9-phenyl-9H-carbazol-3-yl)phenyl)-9H-fluoren-2-amine (HT211) and the like are selected.

Specifically, the thickness of the first auxiliary structure 30 (CPM1) of the red light-emitting unit R ranges from 1 nm to 4 nm, the thickness of the first auxiliary structure 30 (CPM1) of the green light-emitting unit G ranges from 3 nm to 7 nm, the thickness of the first auxiliary structure 30 (CPM1) of the blue light-emitting unit B ranges from 5 nm to 15 nm, and the CPM1 can be formed by combining one or more materials. As the thickness of the CPM1 in the red light-emitting unit R, the green light-emitting unit G and the blue light-emitting unit B is sequentially increased, the thickness of the corresponding cathode 212 is gradually decreased, so that the attenuation trends of the L-decay curves of the red light-emitting unit R, the green light-emitting unit G and the blue light-emitting unit B are controlled to be consistent, and the display colour cast is improved. Meanwhile, as shown in FIGS. 6 and 7, since CPM1 generally has better electron injection property, since the blue light-emitting unit B has a higher mixing ratio than CPM1 in the red light-emitting unit R/green light-emitting unit G, and the electron injection capability of the blue light-emitting unit B is enhanced than that of the red light-emitting unit R/green light-emitting unit G, it is shown that the exciton distribution of the blue light-emitting unit B is closer to the interface between the second auxiliary structure 2137 and the light-emitting layer 2131 with respect to the red light-emitting unit R and the green light-emitting unit G, the exciton distribution of the red light-emitting unit R, the green light-emitting unit G and the blue light-emitting unit B is adjusted, the excitons of the red light-emitting unit R, the green light-emitting unit G and the blue light-emitting unit B can be respectively distributed at the positions where the gains of the optical micro-cavities thereof are maximum, thereby improving the white light efficiency.

Other structures in the third example are the same as those in the first example, and thus, description thereof is not repeated.

Figure 10A:
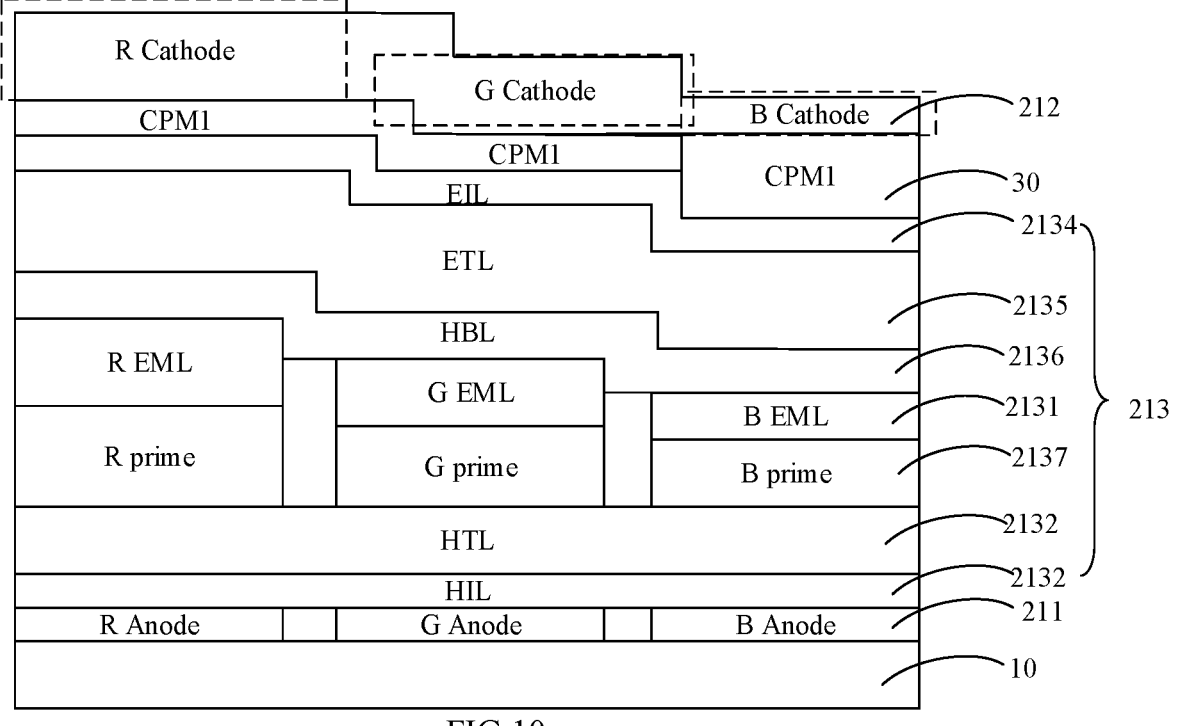
FIG. 10*a* is a cross-sectional view of a pixel unit according to a fourth example of a display panel in an embodiment of the present disclosure.
Figure 10B:
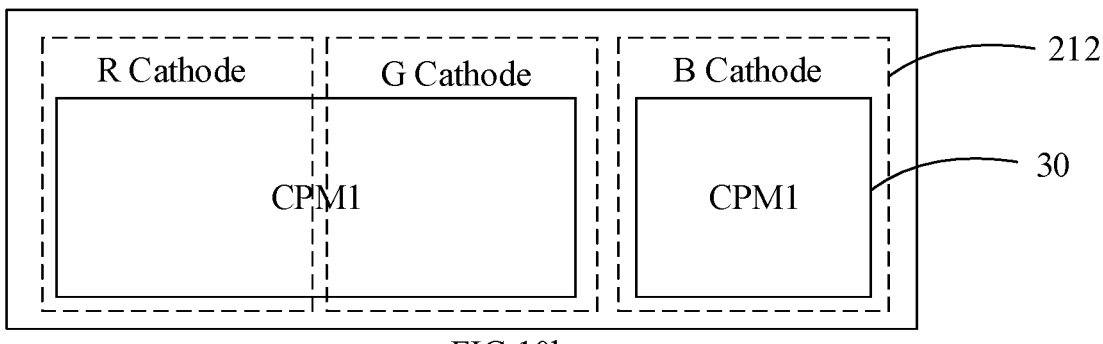
FIG. 10*b* is a top view showing a relationship between first auxiliary structures and cathodes of a pixel unit according to a fourth example of the display panel in an embodiment of the present disclosure.

A fourth example is as follows. FIG. 10a is a cross-sectional view of a pixel unit according to the fourth example of a display panel in an embodiment of the present disclosure; FIG. 10b is a top view of a corresponding relationship between a first auxiliary structure and a cathode of a pixel unit according to the fourth example of the display panel in an embodiment of the present disclosure. As shown in FIGS. 10a and 10b, the structure of the pixel unit in the fourth example is substantially the same as that in the third example except that the first auxiliary structures 30 of the red and green light-emitting units R and G are formed as a one-piece structure and have the same thickness, and at the same time, the cathodes 212 of the red and green light-emitting units R and G have the same thickness.

Specifically, the thickness of the first auxiliary structures 30 (CPM1) of the red light-emitting unit R and the green light-emitting unit G ranges from 1 nm to 7 nm, the thickness of the first auxiliary structure 30 (CPM1) of the blue light-emitting unit B ranges from 5 nm to 15 nm, and the CPM1 can be formed by combining one or more materials. As the thickness of the CPM1 in the red light-emitting unit R or the green light-emitting unit G and the blue light-emitting unit B is sequentially increased, the thickness of the corresponding cathode 212 is gradually reduced, so that the attenuation trends of the L-decay curves of the red light-emitting unit R, the green light-emitting unit G and the blue light-emitting unit B are controlled to be consistent, and the display colour cast is improved. Meanwhile, as shown in FIGS. 6 and 7, since CPM1 generally has better electron injection property, since the blue light-emitting unit B has a higher mixing ratio than CPM1 in the red light-emitting unit R/green light-emitting unit G, and the electron injection capability of the blue light-emitting unit B is enhanced than that of the red light-emitting unit R/green light-emitting unit G, it is shown that the exciton distribution of the blue light-emitting unit B is closer to the interface between the second auxiliary structure 2137 and the light-emitting layer 2131 with respect to the red light-emitting unit R and green light-emitting unit G, the exciton distribution of the red light-emitting unit R, the green light-emitting unit G and the blue light-emitting unit B is adjusted, the excitons of the red light-emitting unit R, the green light-emitting unit G and the blue light-emitting unit B can be respectively distributed at the positions where the gains of the optical micro-cavities thereof are maximum, thereby improving the white light efficiency.

Other structures in the fourth example are the same as those in the first example, and thus the description thereof will not be repeated.

Figures 11A, 11B:
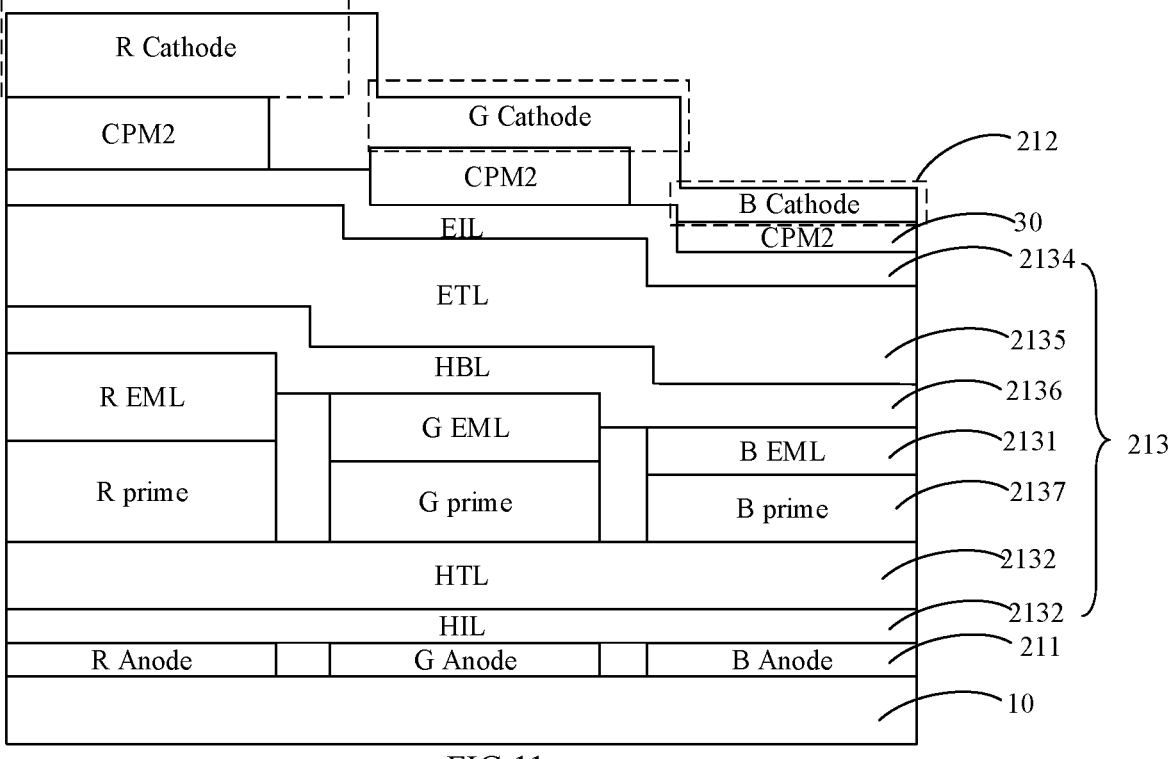
FIG. 11*a* is a cross-sectional view of a pixel unit according to a fifth example of a display panel in an embodiment of the present disclosure.
FIG. 11*b* is a top view showing a relationship between first auxiliary structures and cathodes of a pixel unit according to a fifth example of the display panel in an embodiment of the present disclosure.

A fifth example is as follows. FIG. 11a is a cross-sectional view of a pixel unit according to the fifth example of a display panel in an embodiment of the present disclosure; FIG. 11b is a top view of a relationship between a first auxiliary structure and a cathode of a pixel unit according to the fifth example of the display panel in an embodiment of the present disclosure. As shown in FIGS. 11a and 11B, the structure of the pixel unit in the fifth example is substantially the same as that in the first example except that the first auxiliary structures 30 of the red, green and blue light-emitting units R, G and B employ the second material CPM2, and the thicknesses of the first auxiliary structures 30 of the red, green and blue light-emitting units R, G and B are sequentially decreased.

The second material is a nucleation promoting material (CPM2) for the material of the second electrode layer, for example, one or more of the fullerene including C60, C70, C76, or C84, single-walled carbon nanotubes, multi-walled carbon nanotubes, and the like.

Specifically, the thickness of the first auxiliary structure 30 (CPM2) of the red light-emitting unit R ranges from 5 nm to 15 nm, the thickness of the first auxiliary structure 30 (CPM2) of the green light-emitting unit G ranges from 3 nm to 7 nm, the thickness of the first auxiliary structure 30 (CPM2) of the blue light-emitting unit B ranges from 1 nm to 4 nm, and the CPM2 may be made of one or more materials. Since the thicknesses of the CPM2 in the red light-emitting unit R, the green light-emitting unit G and the blue light-emitting unit B are gradually decreased, the thicknesses of the cathodes 212 of the red light-emitting unit R, the green light-emitting unit G and the blue light-emitting unit B are gradually decreased correspondingly, so that the attenuation trends of the L-decay curves of the red light-emitting unit R, the green light-emitting unit G and the blue light-emitting unit B are controlled to be consistent with each other, and the display colour cast can be improved.

Other structures in the fifth example are the same as those in the first example, and thus description thereof will not be repeated.

Figures 12A, 12B:
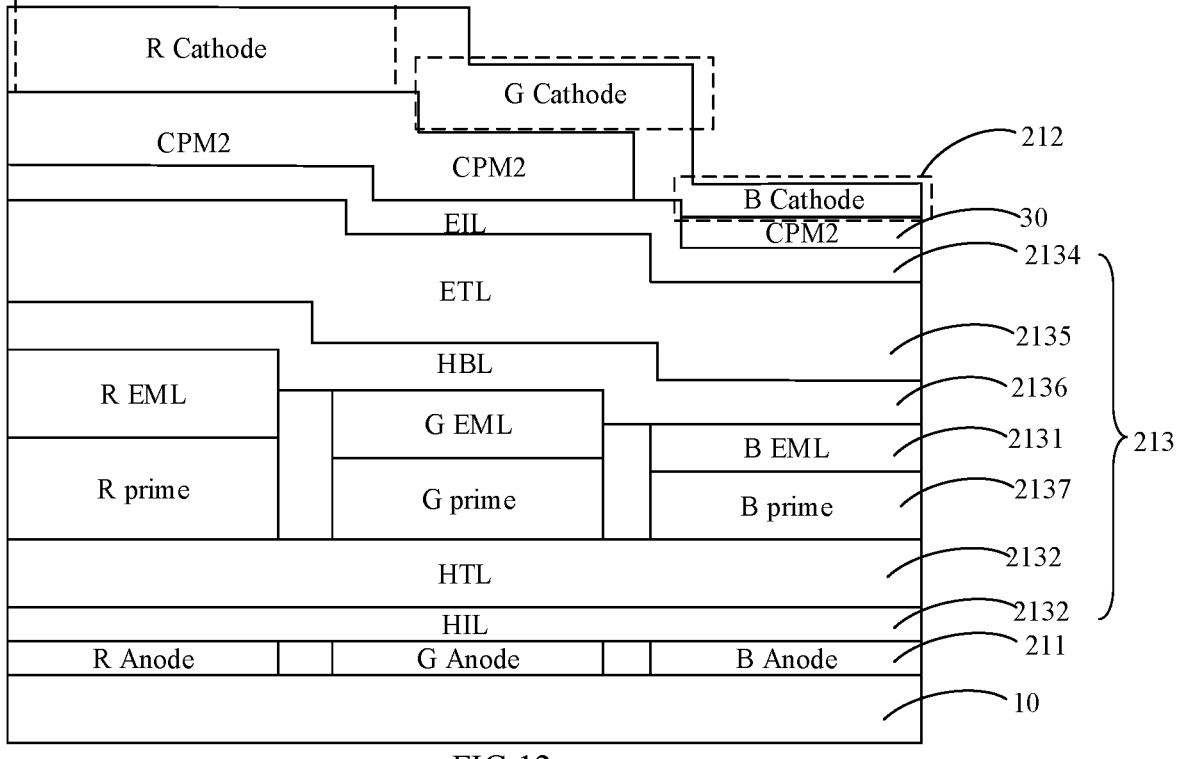
FIG. 12*a* is a cross-sectional view of a pixel unit according to a sixth example of a display panel in an embodiment of the present disclosure.
FIG. 12*b* is a top view showing a relationship between first auxiliary structures and cathodes of a pixel unit according to a sixth example of the display panel in an embodiment of the present disclosure.

A sixth example is as follows. FIG. 12a is a cross-sectional view of a pixel unit according to a sixth example of a display panel in an embodiment of the present disclosure; FIG. 12b is a top view of a relationship between a first auxiliary structure and a cathode of a pixel unit according to a sixth example of the display panel in an embodiment of the present disclosure. As shown in FIGS. 12a and 12b, the structure of the pixel unit in the sixth example is substantially the same as that in the fifth example except that the first auxiliary structures 30 of the red and green light-emitting units R and G are formed as a one-piece structure and formed to have the same thickness. At the same time, the cathodes 212 of the red and green light-emitting units R and G have the same thickness. Since the thicknesses of the CPM2 in the red light-emitting unit R or the green light-emitting unit G, and the blue light-emitting unit B are gradually decreased, the thicknesses of the cathodes 212 of the red light-emitting unit R/the green light-emitting unit G, and the blue light-emitting unit B are gradually decreased correspondingly, so that the attenuation trends of the L-decay curves of the red light-emitting unit R, the green light-emitting unit G, and the blue light-emitting unit B are controlled to be consistent with each other, and the display colour cast can be improved.

Other structures in the sixth example are the same as those in the fifth example, and thus description thereof will not be repeated herein.

It will be understood that the above embodiments are merely exemplary embodiments adopted to illustrate the principles of the present invention, and the present invention is not limited thereto. It will be apparent to those skilled in the art that various modifications and improvements can be made without away from the spirit and essence of the invention, and such modifications and improvements are also considered to be within the scope of the invention.

What is claimed is:

1. A display panel, comprising a base substrate, a plurality of pixel units on the base substrate, wherein each of the plurality of the pixel units comprises a plurality of light-emitting units emitting light in different colors; each of the plurality of light-emitting unit comprises a first electrode, an organic functional layer and a second electrode stacked sequentially along a direction away from the base substrate; and among the plurality of light-emitting units emitting light in different colors in each pixel unit, the second electrode of the light-emitting unit emitting light with a shortest wavelength has a smallest thickness along a direction perpendicular to the base substrate, each of the plurality of light-emitting units comprises a first auxiliary structure on a side of the organic functional layer proximal to the second electrode layer, an adsorption force of the first auxiliary structure of the light-emitting unit emitting light with the shortest wavelength on a material of the second electrode layer is the smallest, the first auxiliary structure comprises a first material and/or a second material, the first material is a nucleation inhibition material for the material of the second electrode layer, and the second material is a nucleation promoting material for the material of the second electrode layer.

2. The display panel of claim 1, wherein the second electrodes of the plurality of light-emitting units in each pixel unit are formed as a one-piece structure as a second electrode layer.

3. The display panel of claim 1, wherein thicknesses of the first auxiliary structures are the same as each other;

the first auxiliary structure comprises the first material and the second material, proportions of the first materials in the first auxiliary structures of the plurality of light-emitting units emitting different colors are different from each other, and the shorter a wavelength of light emitted from the light-emitting device is, the greater the proportion of the first material in the first auxiliary structure of the light-emitting device is.

4. The display panel of claim 1, wherein thicknesses of the first auxiliary structures are the same as each other, and the first auxiliary structure comprises the first material and the second material, the first auxiliary structure of the light-emitting unit emitting light with the shortest wavelength among the plurality of light-emitting units comprises the first material with a largest proportion, the first auxiliary structures of the other light-emitting units comprise the first material with a same proportion.

5. The display panel of claim 1, wherein each of the first auxiliary structures is made of the first material; the shorter the wavelength of light emitted from the light-emitting unit is, the thicker the first auxiliary structure of the light-emitting unit is.

6. The display panel of claim 1, wherein each of the first auxiliary structures is made of the first material; the first auxiliary structure of the light-emitting unit emitting light with the shortest wavelength among the plurality of light-emitting units has a largest thickness, the first auxiliary structures of the other light-emitting units have a same thickness.

7. The display panel of claim 1, wherein each of the first auxiliary structures is made of the second material; the shorter the wavelength of light emitted from the light-emitting unit is, the thinner the first auxiliary structure of the light-emitting unit is.

8. The display panel of claim 1, wherein each of the first auxiliary structures is made of the second material; the first auxiliary structure of the light-emitting unit emitting light with the shortest wavelength among the plurality of light-emitting units has a smallest thickness, the first auxiliary structures of the other light-emitting units have a same thickness.

9. The display panel of claim 1, wherein the first auxiliary structure comprises the first material, the first material is selected from one or more of polytetrafluoroethylene (PTFE), silicon or silicone-based polymer, 3-(4-biphenyl)-4-phenyl-5-tert-butylphenyl-1, 2, 4-Triazole (TAZ), aluminum (III) bis(2-methyl-8-quninolinato)-4-phenylphenolate (BAlq),2-(4-(9,10-di(naphthalen-2-yl) anthracen-2-yl)phenyl)-1-phenyl-1H-benzo-[D]imidazole (LG201), 8-hydroxyquinoline lithium (Liq), N (biphenyl-4-yl) 9,9-dimethyl-N-(4 (9-phenyl-9H-carbazole-3-yl)phenyl)-9H-fluorene-2-amine (HT211).

10. The display panel of claim 1, wherein the first auxiliary structure comprises the second material, the second material is selected from one or more of the fullerene including C60, C70, C76, or C84, single-walled carbon nanotubes, multi-walled carbon nanotubes.

11. The display panel of claim 1, wherein the organic functional layer comprises a hole injection layer, a hole transport layer, a light-emitting layer, a hole blocking layer, an electron transport layer, and an electron injection layer stacked in sequence along in a direction away from the first electrode.

12. The display panel of claim 11, wherein the hole injection layers of the light-emitting units in each pixel unit are formed as a one-piece structure, the hole transport layers of the light-emitting units in each pixel unit are formed as a one-piece structure, the hole blocking layers of the light-emitting units in each pixel unit are formed as a one-piece structure, the electron injection layers of the light-emitting units in each pixel unit are formed as a one-piece structure, and the electron transport layers of the light-emitting units in each pixel unit are formed as a one-piece structure.

13. The display panel of claim 11, wherein the light-emitting unit further comprises a second auxiliary structure between the hole transport layer and the light-emitting layer, the second auxiliary structure is configured to adjust a length of a resonant cavity formed between the first electrode and the second electrode of the light-emitting unit.

14. The display panel of claim 13, wherein a wavelength of light emitted from the light-emitting unit is positively correlated with a thickness of the second auxiliary structure in the direction perpendicular to the base substrate.

15. The display panel of claim 13, wherein a thickness of the second electrode of the light-emitting unit in the direction perpendicular to the base substrate is positively correlated with a thickness of the second auxiliary structure in the direction perpendicular to the base substrate.

16. The display panel of claim 1, wherein the light-emitting units emitting light in different colors in each pixel unit comprise a red light-emitting unit, a green light-emitting unit, and a blue light-emitting unit.

* * * * *